(12) United States Patent  (10) Patent No.: US 7,323,080 B2
Kim et al.  (45) Date of Patent: Jan. 29, 2008

(54) APPARATUS FOR TREATING SUBSTRATE

(75) Inventors: In-Jun Kim, Inoheon-gwangyeoksi (KR); Jung-Keun Cho, Seoul (KR); Jang-Seob Choi, Cheonan-si (KR); Yong-Nam Choi, Seoul (KR); Jeong-Yong Bae, Cheonan-si (KR)

(73) Assignee: Semes Co., Ltd., Chungcheongnam (KR)

( * ) Notice: Subject to any disclaimer, the term of this patent is extended or adjusted under 35 U.S.C. 154(b) by 0 days.

(21) Appl. No.: 11/084,034

(22) Filed: Mar. 21, 2005

(65) Prior Publication Data

US 2005/0247667 A1  Nov. 10, 2005

(30) Foreign Application Priority Data

May 4, 2004  (KR) ............... 10-2004-0031368
May 4, 2004  (KR) ............... 10-2004-0031369
May 4, 2004  (KR) ............... 10-2004-0031371

(51) Int. Cl.
  *C23F 1/00* (2006.01)
(52) U.S. Cl. .............. 156/345.33; 156/345.21; 156/345.39; 156/345.42
(58) Field of Classification Search ........... 156/345.55, 156/345.21, 345.22, 345.31, 345.39–345.4, 156/345.42–345.43, 345.33; 134/902, 1.1; 118/730; 216/58, 67; 451/66
See application file for complete search history.

(56) References Cited

U.S. PATENT DOCUMENTS 5,945,351 A  8/1999  Mathuni
6,280,645 B1 *  8/2001  Yanagisawa et al. ......... 216/38
6,406,589 B1 *  6/2002  Yanagisawa ............. 156/345.3
6,939,807 B2 *  9/2005  Yun et al. ................... 438/704
6,989,228 B2 *  1/2006  Kojima et al. .............. 430/311
2002/0023896 A1 *  2/2002  Tachino et al. ............... 216/67
2005/0247667 A1 *  11/2005  Kim et al. .................... 216/57

FOREIGN PATENT DOCUMENTS

CN  1492485 A  4/2004
JP  6-251894 A  9/1994
JP  07-142449  6/1995
JP  7-142449 A  6/1995
JP  7-211491 A  8/1995

(Continued)

OTHER PUBLICATIONS

Korean Patent Office Communication dated Oct. 31, 2005 (with English translation) for Application No. KR 10-2004-0031368.

(Continued)

*Primary Examiner*—Sylvia R. MacArthur
(74) *Attorney, Agent, or Firm*—Harness, Dickey & Pierce, P.L.C.

(57) ABSTRACT

The present is directed to an apparatus for etching the top edge and bottom of a wafer. The apparatus includes a substrate support part for supporting a wafer and a movable protect part for preventing fluid for an etch from flowing into a non-etch portion of the wafer. The top edge and bottom of the wafer is etched by a wet etch, and a boundary of the non-etch portion and the edge of the wafer is etched by a dry etch.

18 Claims, 17 Drawing Sheets

FOREIGN PATENT DOCUMENTS

| | | |
|---|---|---|
| JP | 7-245192 A | 9/1995 |
| JP | 11-54479 A | 2/1999 |
| JP | 11-260597 A | 9/1999 |
| JP | 13-156039 | 8/2001 |
| JP | 2002-124501 A | 4/2002 |
| JP | 2003-264168 A | 9/2003 |
| KR | 2000-0052534 A | 8/2000 |
| KR | 2002-0009248 A | 2/2002 |
| KR | 10-0346524 A | 7/2002 |
| KR | 10-0034856 A | 4/2004 |
| KR | 10-2004-0075125 A | 8/2004 |
| KR | 10-2004-0088507 A | 10/2004 |
| KR | 2004-88507 | 10/2004 |
| WO | WO 02/01617 A1 | 1/2002 |

OTHER PUBLICATIONS

Korean Patent Office Communication dated Oct. 31, 2005 (with English translation) for Application No. KR 10-2004-0031369.

* cited by examiner

APPARATUS FOR TREATING SUBSTRATE

FIELD OF THE INVENTION

The present invention relates to apparatus and method for treating a substrate and, more particularly, to apparatus and method for etching the top edge and the bottom of a substrate.

BACKGROUND OF THE INVENTION

A plurality of layers such as polysilicon, oxide, nitride, and metal are deposited on a wafer that is used as a semiconductor substrate in a semiconductor fabricating process. A photoresist layer is coated on the layer. A pattern drawn on a photo mask using an exposure process is transcribed to the photoresist layer. An etching process is carried out to form a desired pattern on the wafer. Foreign substances such as various layers or photoresist remain the top edge or the bottom of a wafer where the above-mentioned processes are carried out. If the edge of a held wafer is transferred, the foreign substances are separated from the wafer to be dispersed. The dispersed substances contaminate an apparatus and act as particles in subsequent processes. Thus, a process for etching the edge of a wafer is required.

Conventionally, among a pattern-formed surface of a wafer, a portion except a to-be-etched wafer edge (hereinafter, the portion being referred to as "non-etch portion") is protected with a protectant or a mask and then is submerged in a bath filled with an etchant to etch the wafer edge. In the wet etch, an etch rate is higher but a layer is inclined at a boundary portion of the non-etch portion and the edge of the wafer to lower a yield because the wet etch is an isotropic etch. Further, the above-described method includes protecting a pattern-formed portion with a protectant or a mask and re-removing the same, which results in a long work time and consumption of a large amount of etchant.

SUMMARY OF THE INVENTION

Exemplary embodiments of the present invention are directed to apparatus and method for treating a substrate to etch the top edge and the bottom of the substrate at a high speed and to prevent a yield lowering caused by an isotropic etch that is a wet etch. In an exemplary embodiment, the apparatus includes a substrate support part, a wet etch part, and a dry etch part. The substrate support part has a rotatable support plate and a support pin protruding from a top surface of the support plate to support a substrate to be spaced apart from a top surface of the support plate. The wet etch part supplies an etchant to a space between a substrate placed on the support pin and the support plate to perform an etch, and a dry etch part supplies plasma to the top edge of a substrate placed on the support plate to perform an etch.

In some embodiments, the dry etch part has a plasma torch, a torch moving part, and a gas supply part. The plasma torch enables internally supplied gas to be excited into a plasma state and injects generated plasma to the edge of the substrate. The plasma torch may be moved vertically or horizontally by a torch moving part. The gas supply part supplies gas into the plasma torch. The gas supply part includes a first supply pipe configured for supplying an etch gas to the plasma torch during an etch process and a second supply pipe configured for supplying oxygen gas onto the substrate after the etch process is completed.

In some embodiments, the wet etch part has a chemical flow path formed in the support plate as a flow path of an etchant supplied to the space and a chemical supply pipe connected with the chemical supply part and the chemical flow path to supply an etchant to the chemical flow path.

In some embodiments, the apparatus may further include a protection part for preventing a fluid used in an etch from flowing into a non-etch portion of a top surface of the substrate, the non-etch portion being a portion to be unetched. The protect part has a protect cover that may be moved vertically or horizontally by a cover moving part. The plasma torch may be connected with the protect cover. The protect cover has a protrusion formed to correspond to a boundary portion of the non-etch portion and the edge of the substrate and a bottom where a supply hole is configured for injecting nitrogen gas or inert gas into the protrusion.

In some embodiments, the etch using the dry etch part and the etch using wet etch part may be performed at the same time. Alternatively, the etch using the wet etch part may be followed by the etch using the dry etch part. An inclination of a layer etched at the boundary portion of the edge and the non-etch portion of the substrate may be regulated by the dry etch part. The top edge and the bottom of the substrate may be etched by the wet etch part, and a portion adjacent to the boundary portion of the edge and the non-etch portion of the substrate may be etched by the dry etch part.

In some embodiments, the plasma torch has a body and an electrode part. The body is made of dielectric material, in which a gas inflow space is formed. The electrode part includes a first electrode inserted into the gas inflow space of the body and a second electrode disposed to cover at least a part of the outer sidewall of the body. By an energy source, an energy is applied to the first and second electrodes. The energy source may be a microwave or high-frequency power. The first electrode may be made of tungsten, and the second electrode may be made of copper. Further, the second electrode may be a coil-type electrode or a plate-type electrode.

In some embodiments, at least a part of the body is covered with a dielectric substance made of dielectric material. The dielectric substance may be formed separately from the first electrode and may be disposed to cover the first electrode. Alternatively, the dielectric substance may be formed by coating the first electrode with dielectric material. The dielectric substance may be disposed to entirely cover the first electrode or to partially cover the end of the first electrode.

In some embodiments, the gas inflow space is straightly formed in the body, and the first electrode is a rod-shaped electrode that is straightly disposed at the center of the space along the gas inflow space. The plasma torch further includes a cover disposed to cover the second electrode. Due to the lid, the second electrode is not exposed to the outside. The cover may be made of Teflon. The plasma torch further includes at least one electrode holder disposed at the space in the body to fix the first electrode.

In some embodiments, the apparatus further includes a magnet for establishing a magnetic field at a migration path of plasma generated in the body to offer an acceleration force to the plasma. The magnet is disposed to cover an outer sidewall of the body below the second electrode. Alternatively, the magnet is disposed at the support part. The magnet may be a permanent magnet.

In an exemplary embodiment, the method includes placing a substrate on a support pin to be spaced apart from a support plate; and supplying an etchant between the support plate and the bottom of the substrate and supplying plasma for an etch to the top edge of the substrate. The bottom of the substrate is etched using the etchant, and the top edge of the substrate is etched using the plasma or the plasma and the etchant.

In some embodiments, after supplying the etchant and the plasma, the method may further include cleaning the substrate using a cleaning solution; and rotating the support plate to dry the substrate and simultaneously supplying oxygen plasma to the substrate. Thus, while the substrate is dried by the oxygen plasma, foreign substances remaining on the substrate are removed secondarily and a passivation film is formed on the substrate.

In some embodiments, after placing the substrate on the support pin, the method may further include protecting a non-etch portion of a top surface of the substrate. Protecting the non-etch portion may include moving a protect cover onto the substrate; and injecting nitrogen gas or inert gas from an injection port formed at the bottom of the protect cover. The protect cover has a protrusion formed to correspond to a boundary portion of the non-etch portion and the edge of the substrate.

BRIEF DESCRIPTION OF THE DESCRIPTION

DETAILED DESCRIPTION OF THE INVENTION

Figure 1:
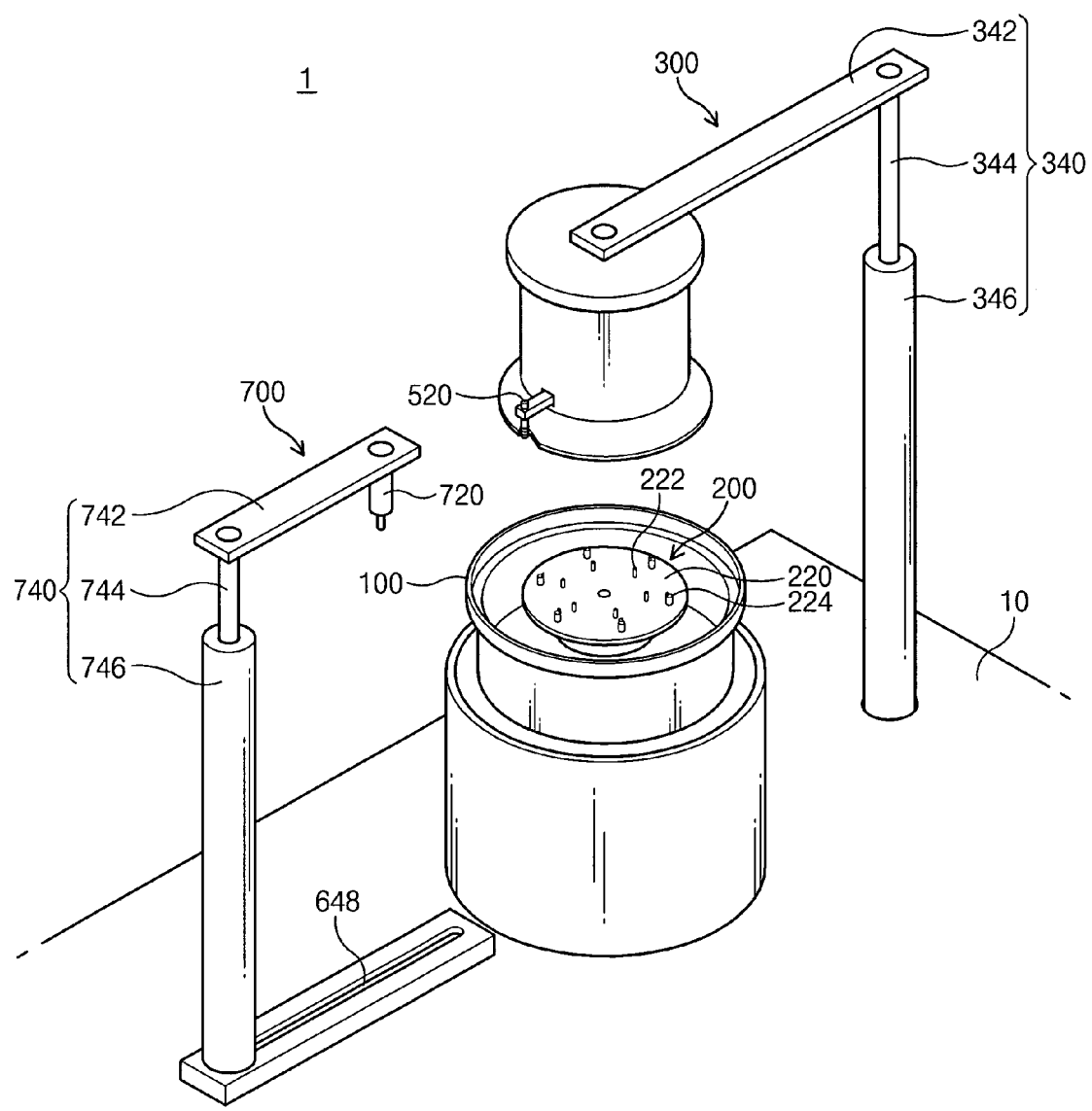
FIG. 1 is a perspective view of a substrate treating apparatus according to the present invention.

The present invention will now be described more fully hereinafter with reference to the accompanying drawings, in which a preferred embodiment of the invention is shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the height of layers and regions are exaggerated for clarity.

In the embodiment of the invention, a top surface (24 of FIG. 8) of a wafer (20 of FIG. 8) means a pattern-formed one of both surfaces of the wafer, and a bottom surface (22 of FIG. 8) thereof means the other surface. Hereinafter, a to-be-etched portion of the top surface will be referred to as "edge" and a to-be-unetched portion thereof will be referred to as "non-etch portion" (24b of FIG. 8)".

FIG. 1 is a perspective view of a substrate treating apparatus 1 according to the present invention. The apparatus 1 etches and cleans the edge 24a and a bottom surface 22 of a semiconductor substrate such as a wafer.

As illustrated in FIG. 1, the apparatus 1 includes a substrate support part 200, a protection part 300, a wet etch part 400, a dry etch part 500, and a cleaning solution supply part 700. The substrate support part 200 supports a wafer 20 during a process. The protection part 300 prevents a fluid used in an etch from flowing into a non-etch portion 24b of the wafer 20. The wet etch part 400 supplies an etchant to etch the edge 24a and the bottom surface 22 of the wafer 20, and the dry etch part 500 supplies plasma to a boundary portion of the edge 24a and the non-etch portion 24b of the wafer 20 to etch the same. The cleaning solution supply part 700 supplies a cleaning solution to a completely etched wafer 20 to clean the same.

The substrate support part 200 is disposed on the base 10 and includes a support plate 220 having a circular top surface. The top surface of the support plate 200 has a similar diameter to the wafer 20. A plurality of support pins 222 protruding upwardly are mounted on the top surface of the support plate 220. The wafer 20 is placed on the support pins 222 to be spaced apart from the top surface of the support plate 220 during a process. Due to the above-described structure, a space (30 of FIG. 4) is formed between the bottom surface 22 and the support plate 220. Fluid used in an etch may flow into the space to etch the bottom surface 22. A plurality of align pins 224 are disposed at the edge of the support plate 220 to align a wafer 20 placed on the support pins 222 in place. Due to the align pins 224, the wafer 20 is not separated from the support plate 220 during the process. A support rod (240 of FIG. 4) is connected with the bottom of the support plate 220 to support the support plate 220. A driving part such as a motor 260 is connected with the support rod 240 to rotate the wafer 20 during the process. A cylindrical bowl 100 is disposed to cover the substrate support part 200. The bowl 100 has an open top and prevents chemicals used in the process from splashing to the outside.

The protection part 300 has a protect cover 320 and a cover moving part 340. The protect cover 320 is spaced apart from the top surface 24 to face the wafer 20 during the process, protecting the non-etch portion 24b of the wafer 20. The cover moving part 340 moves the protect cover 320 vertically or horizontally.

Figure 2:
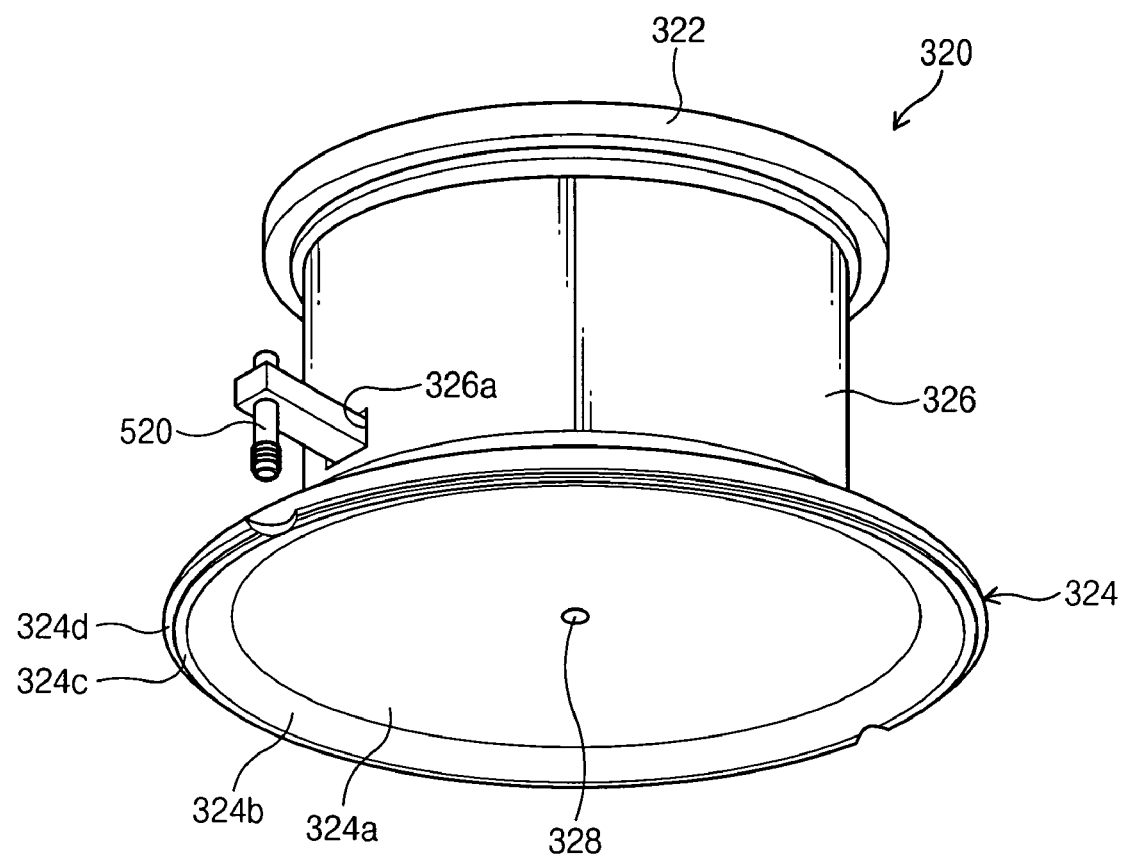
FIG. 2 is a perspective view of a protect cover shown in FIG. 1, viewed from the bottom.

As illustrated in FIG. 2, the protect cover 320 has an upper plate 322, a lower plate 324, and a cylindrical sidewall 326. The lower plate 324 has a horizontal portion 324a and an inclined portion 324b. The horizontal portion 324a is planarly disposed at the center of the lower plate 324, and the inclined portion 324b extends from the horizontal portion 324a to be inclined downwardly at a determined angel. A ring-shaped boundary portion 324c, which protrudes downwardly, is formed at the end of the inclined portion 324b. The boundary portion 324c has a shape corresponding to a boundary portion of the non-etch portion 24b and the edge 24a of the wafer 20. A guide 324d is formed at the outside of the boundary portion 324c to be taller than the boundary portion 324c. Due to the above-described structure, a predetermined space (30 of FIG. 4) is offered to be surrounded by the non-etch portion 24b of the wafer 20, the horizontal portion 324a of the protect cover 320, the inclined portion 324b, and the boundary portion 324c during an etch process. An injection port 328 is formed at the center of the horizontal portion 324a to inject nitrogen gas downwardly. Instead of the nitrogen gas, inert gas may be supplied. The nitrogen gas prevents a fluid supplied to the edge 24a of the wafer 20 from flowing into the space 30 through a gap between the wafer 20 and the boundary portion 324c. The inclined portion 324b allows nitrogen gas injected into the space 30 to smoothly move outside without turbulence creation. The guide portion 324d disposed outside the boundary portion 324c prevents the fluid supplied to the edge 24a of the wafer 20 from splashing thereover.

Figure 3:
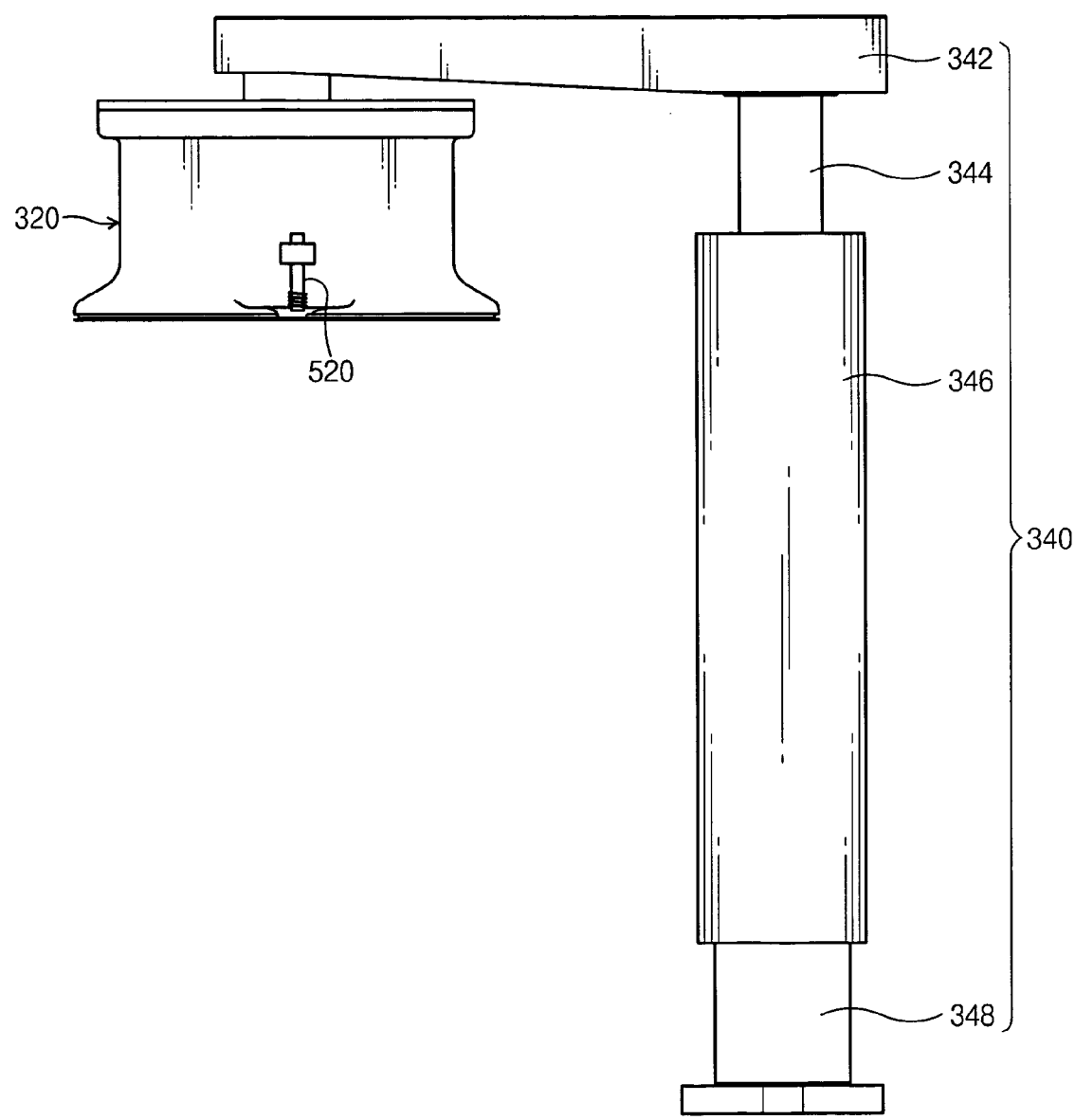
FIG. 3 is a front view of a protect cover and a cover moving part.

Before the process starts, the protect cover 320 is being disposed to be separated from the top of the substrate support part 200. When the wafer 20 is placed on the substrate support part 200, the protect cover 320 is moved by the cover moving part 340 to be spaced apart from the wafer 20 as long as a predetermined distance and to be disposed over the wafer 20. As illustrated in FIG. 3, the cover moving part 340 has a supporter 342, a feed rod 344, a transfer rod guide 346, and a driving part 348. One end of the supporter 342 is connected to the upper plate 322 of the protect cover 320 to support the protect cover 320. The feed rod 344, which is vertically disposed and is movable up and down or rotatable by means of the driving part 348, is connected to the other end of the supporter 342. The feed rod 344 is inserted into a through-hole formed in the feed rod guide 346 to move up and down along the feed rod guide 346. The feed rod guide 346 may be fixed on the base 10.

Figure 4:
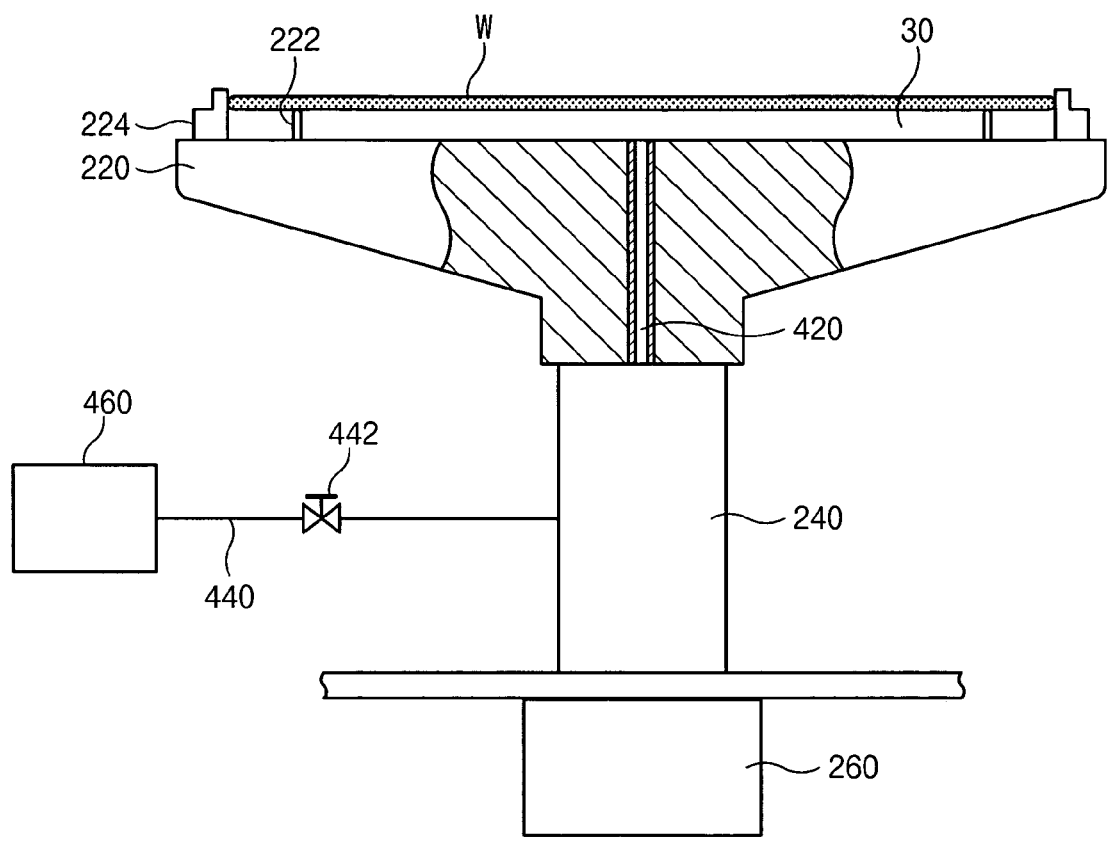
FIG. 4 shows a wet etch part having a plasma torch.

The wet etch part 400 supplies an etchant to the wafer 20 to etch the top edge 24a and the bottom surface 22 of the wafer 20. FIG. 4 shows a section of the substrate support part 200 shown in FIG. 1 and a configuration of the wet etch part 400. The wet etch part 400 has a chemical flow path 420, a chemical supply pipe 440, and a chemical supply part 460. An etchant used in an etch process is stored in the chemical supply part 460 and is supplied to the chemical flow path 420 through the chemical supply pipe 440. A valve 442 for opening/closing a path of the chemical supply pipe or a pump (not shown) for forcibly sending an etchant may be connected to the chemical supply pipe 440. The chemical flow path 420 is formed in the substrate support pat 200. The etchant supplied to the chemical flow path 420 is supplied to the space 30 between the wafer 20 placed on the support pin 222 and the support plate 220 along the chemical flow path 420. A hole is formed at the center of the support plate 220 and the support rod 240 to act as the chemical flow path 420. The etchant supplied to the foregoing space is pervaded from the center of the substrate plate 220 to the edge thereof by a supply pressure to etch the bottom surface 22 of a wafer and flows to the top edge 24a of the wafer. A suction part (not shown), to which a vacuum pump is connected, is installed at a lateral portion of the support plate 220. The suction part may control an etchant to be supplied up to the top edge 24a of a substrate or may control a flow direction of the etchant.

When the etch is performed only by the wet etch part 400, a lateral face of a layer (28 of FIG. 8) is etched to be inclined at a determined angle because the etch is an isotropic etch. The dry etch part 500 uses plasma to etch the top edge 24a (particularly, a boundary portion between a non-etch portion 24b and the top edge 24a) of a wafer. The dry etch part 500 etches the lateral face of the layer 28 vertically.

When the etch is performed only by the wet etch part 400, a lateral face of a layer (28 of FIG. 8) is etched to be inclined at a determined angle because the etch is an isotropic etch. The dry etch part 500 uses plasma to etch the top edge 22a (particularly, a boundary portion of an etch portion and the edge) of a wafer. The dry etch part 500 etches the lateral face of the layer 28 vertically.

Figure 5:
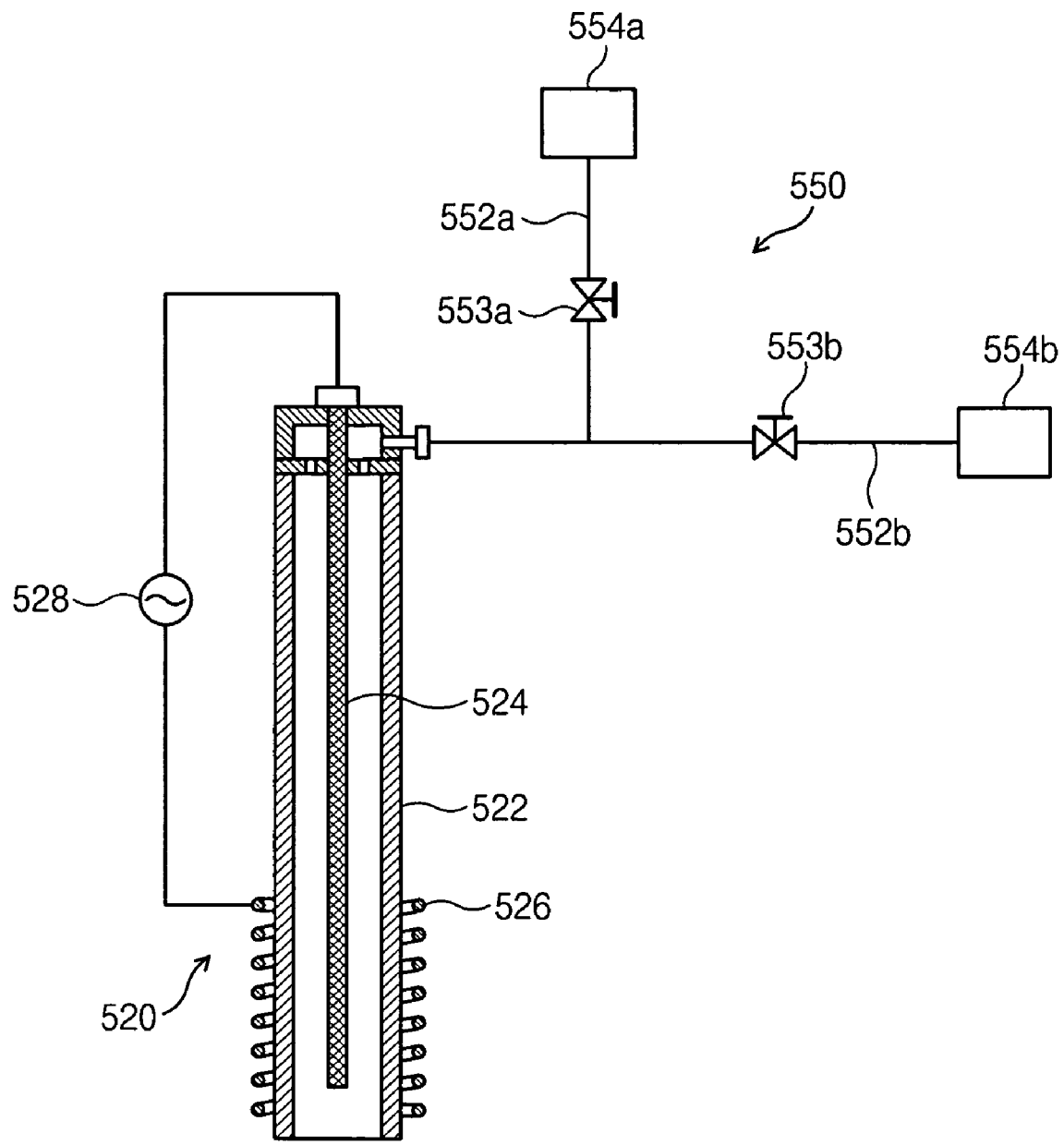
FIG. 5 shows a dry etch part.

As illustrated in FIG. 5, the dry etch part 500 has a plasma torch 520, a torch moving part 540, and a gas supply part 550. The plasma torch 520 generates plasma from gas supplied thereinto at an atmospheric pressure and supplies the plasma to the edge 24a of a wafer. The plasma torch 520 is made of dielectric material and has a hollow cylindrical body 522. That is, the body 522 of the plasma torch 520 is open. A first electrode 524 is inserted long into the body 522. The first electrode 524 is a rod-shaped electrode made of metal. A second electrode 524 is inserted into the outer sidewall of the body 522. The second electrode 524 is s coil-type electrode made of metal, which surrounds the body 522. The first and second electrode 524 and 526 may be made of tungsten. A power part 528 is coupled with the first and second electrodes 524 and 526 to apply an energy for generation of plasma. The energy may be a microwave or high-frequency power. The body 522 receives gas from the gas supply part 550.

The gas supply part 550 supplies an etch gas into the body 522 from a gas storage 544a and has a first supply pipe 552a connected to the body 522. The etch gas may be carbon tetrafluoride ($CF_4$) or helium gas (He). A second supply pipe 552b branches from the first supply pipe 552a to supply oxygen gas into the body 522 of the plasma torch 520 from the gas storage 554b during a drying process. The plasma torch 520 transitions the gas supplied into the body 522 to plasma state and supplies the plasma-state gas to the wafer edge 24a (particularly, a portion adjacent to a non-etch portion 24b). Plasma-state oxygen supplied to the wafer 20 after an etch process serves to remove foreign materials remaining at the wafer edge 24a and forms a passivation film on the wafer 20 to prevent formation of a native oxide layer. The torch moving part 540 moves a plasma torch 520 vertically or horizontally. Initially, the plasma torch 520 is disposed to deviate from the upside of a wafer. If the wafer is then placed on a substrate support part 200, the plasma torch 520 is transferred to the upside of the wafer edge 24a. In an exemplary embodiment, the torch moving part 540 may be coupled with the above-described protect cover 320, as shown in FIG. 1. In this case, the plasma torch 520 may be vertically or horizontally moved with the protect cover 320 by a cover moving part 340. The torch moving part 540 may enables only the plasma torch 520 to move straightly, independently of the protect cover 320.

Figure 6:
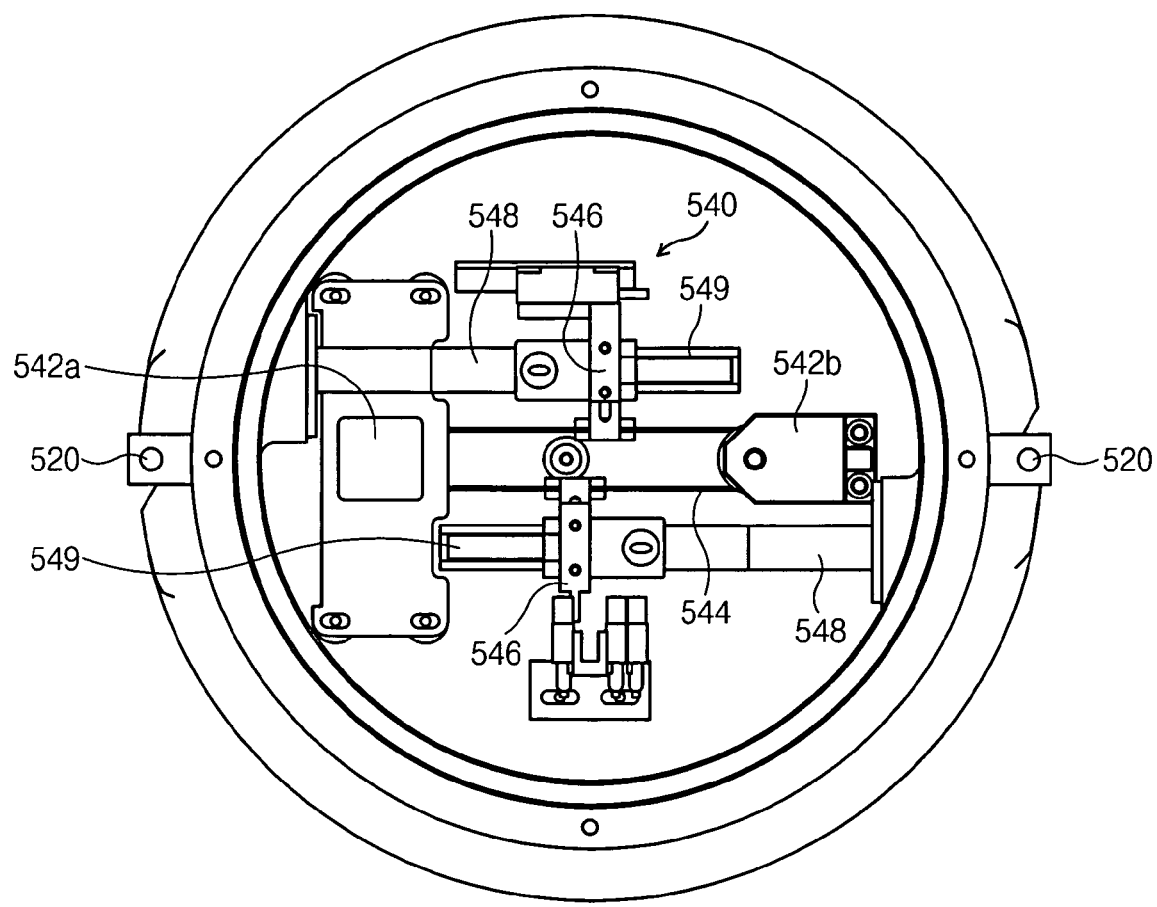
FIG. 6 is a top plan view of the protect cover whose a top is open.

FIG. 6 illustrates a torch moving part 540, in which a protect cover 320 has an open top. The torch moving part 540 has a driving pulley 542a, a driven pulley 542b, a belt 544, a bracket 546, a torch supporter 548, and a guide rail 549. A through-hole (326a of FIG. 2) is formed at a sidewall of the protect cover 320. The torch supporter 548 is inserted the through-hole 326a. One end of the torch supporter 548 is disposed outside the protect cover 320, to which the above-described plasma torch 520 is connected. The other end of the torch supporter 548 is disposed inside the protect cover 320, to which a supporter driving part is connected to move the same. In an exemplary embodiment, a torch driving part may include a pulley and a belt. The driving pulley 542a is disposed at one side in the protect cover 320, and the driven pulley 542b is disposed at the other side in the protect cover 320 to face the driving pulley 542a. The driving pulley 542a and the driven pulley 542b are interconnected by a belt 544. If the driving pulley 542a is rotated by a motor (not shown), the belt 544, the bracket 546, and the torch supporter 548 move straightly. Alternatively, two plasma torches 520 may be coupled with the protect cover 320 and a bracket 546 to which a torch supporter 548 is coupled may be connected to both belts 544.

Figure 7:
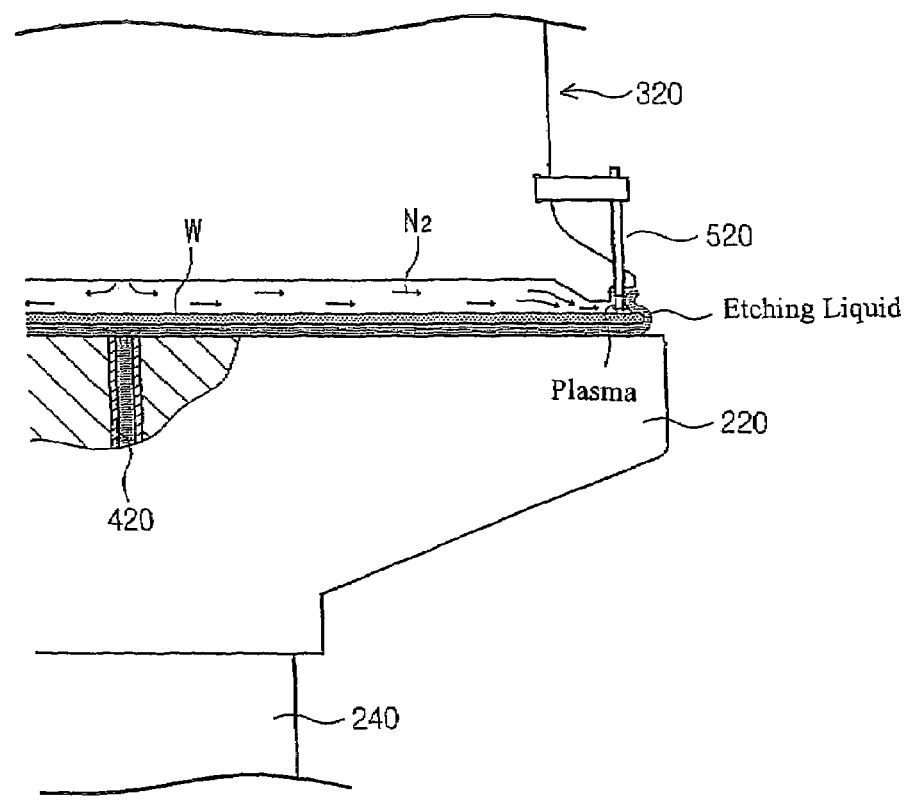
FIG. 7 shows that a dry etch and a wet etch are performed at the same time.

As illustrated in FIG. 7, an etchant supplied from a wet etch part 400 etches the bottom 22 and the top edge 24a of a wafer, and plasma supplied from a dry etch part 500 etches a portion adjacent to a boundary portion between a non-etch portion 24b and the edge 24a of the wafer.

Figure 8:
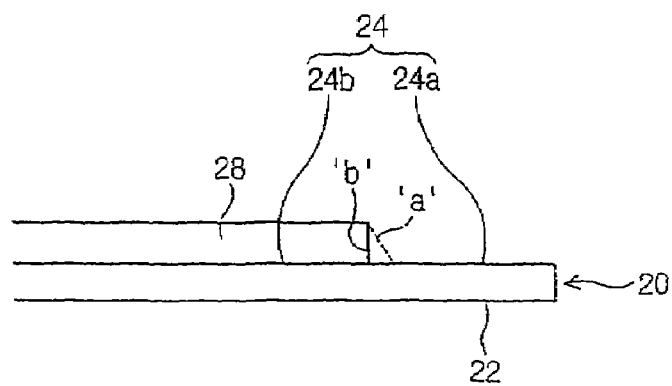
FIG. 8 shows states of a layer when only a wet etch is performed and a wet etch and a dry etch are simultaneously performed using the apparatus according to the present invention.

Referring to FIG. 8, in the case where a wet etch is only performed, a side of a layer is etched to be inclined (see "a" of FIG. 8) because the wet etch is an isotropic etch. In the case where a wet etch and a dry etch are simultaneously performed like the present invention, a side of a layer is etched vertically (see "b" of FIG. 8). Alternatively, the inclination of the side of the layer may be regulated by controlling a direction of plasma supplied from a plasma torch.

If the wet etch is completed, a wafer 20 is cleaned by a cleaning solution supply part 700. Deionized water (DI water) may be used as a cleaning solution. Returning to FIG. 1, the cleaning solution supply part 700 has a nozzle 720 for supplying a cleaning solution and a nozzle moving part 740 for moving the nozzle 720 vertically or horizontally. The nozzle moving part 740 is coupled with the nozzle 720 and has a nozzle supporter 742 for supporting the nozzle 720. A movable rod 744 is connected to the end of the nozzle supporter 742. The movable rod 744 is driven by a driving part (not shown) such as a cylinder or a motor and is installed to be inserted into a through-hole of a guide 746. The movable rod 744 is movable up and down along the guide 746 and is straightly movable along a slit 648. When a wafer 20 is cleaned, the nozzle 720 is disposed over the center of the wafer 20 to supply DI water to the center of the wafer 20. Alternatively, the nozzle 720 is coupled with the protect cover 320 and thus DI water is supplied to the wafer edge 24a to perform a cleaning process.

As described above, the bottom 22 of the wafer 20 is etched using an etchant and the top edge 24a of the wafer 20 is etched using an etchant and plasma. However, the bottom 22 of the wafer 20 may be etched using an etchant and the top edge 24a of the wafer 20 may be etched only using plasma.

Further, as described above, an etch is simultaneously performed by the wet etch part 400 and the dry etch part 500. However, an etch performed by the wet etch part 400 may be followed by an etch performed by the dry etch part 500.

Figure 9:
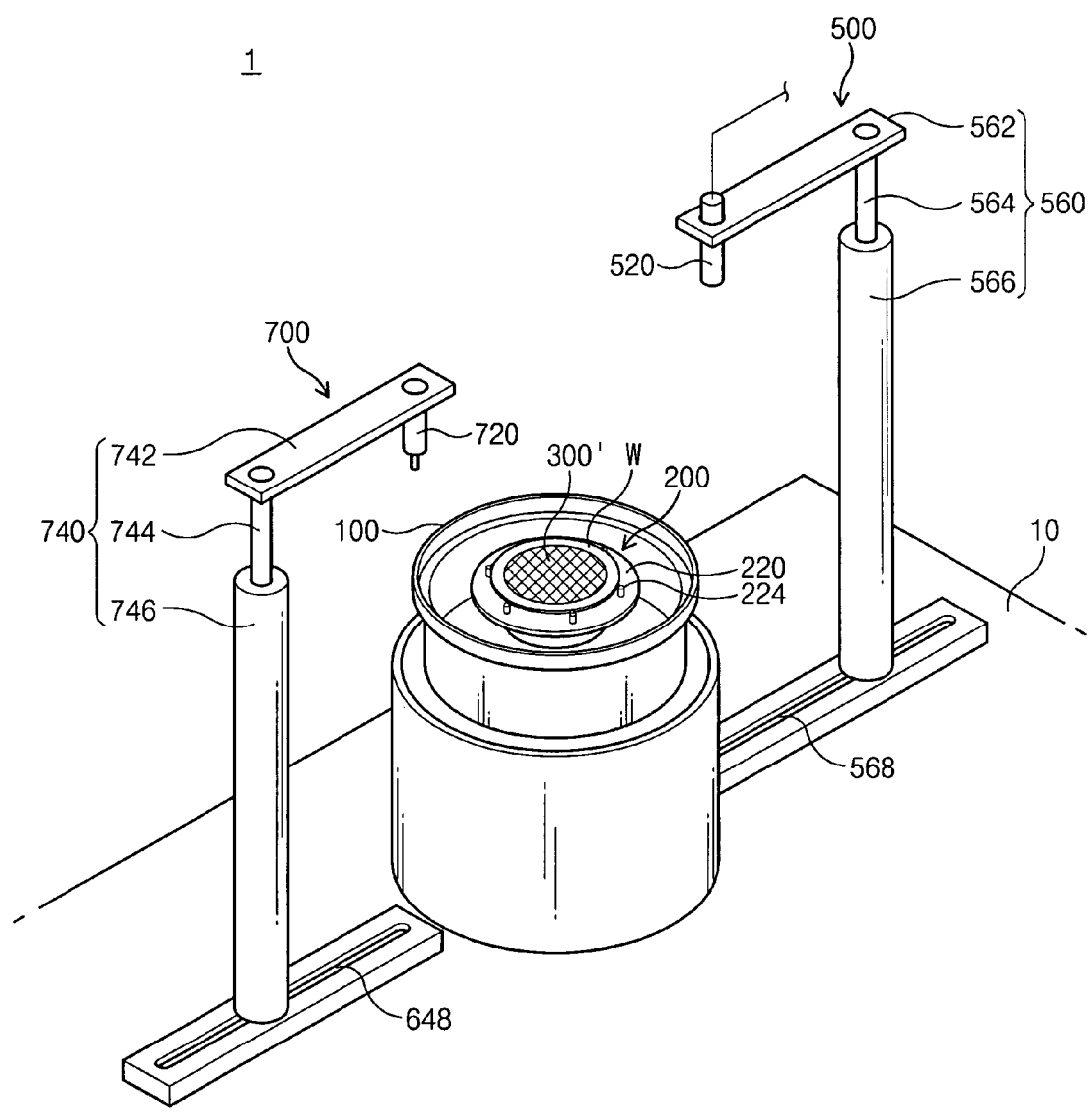
FIG. 9 is a perspective view showing a modified version of the substrate treating apparatus according to the present invention.

FIG. 9 shows anther example of a substrate treating apparatus according to the present invention. In FIG. 9, a substrate support part 200, a cleansing solution supply part 700, a wet etch part 400, and a plasma torch 520 are the same shapes and functions as described above and will not be described in further detail. Instead of the protect cover 320 described in the above embodiment, a protectant or a protect mask 300' directly attached to a wafer is used to protect a non-protect portion 24b of the wafer. A torch moving part 560 is disposed at one side of a base 10 to move the plasma torch 520 vertically or horizontally. The torch moving part 560 is coupled with the plasma torch 520 and has a torch supporter 526 for supporting the plasma torch 520. A movable rod 546 is installed to be inserted into a through-hole of a guide 566 fixedly mounted on the base 10 and is movable up and down along the guide 566. A slit 568 may be formed at the base 10 to guide a vertically straight movement of the movable rod 564.

Figure 10:
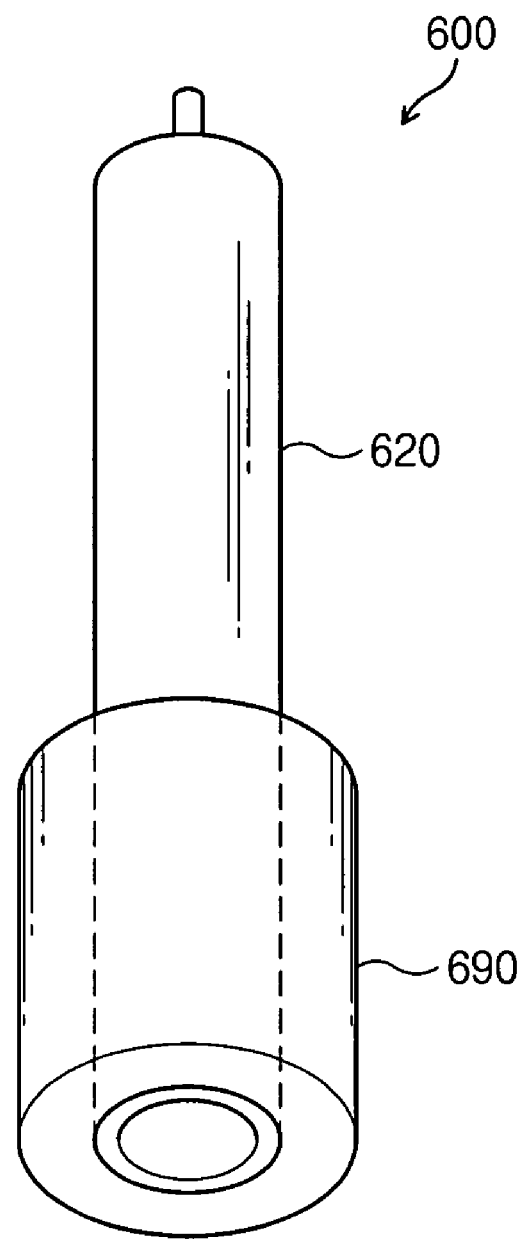
FIG. 10 and FIG. 11 are a perspective view and a cross-sectional view showing other examples of a plasma torch, respectively.
Figure 11:
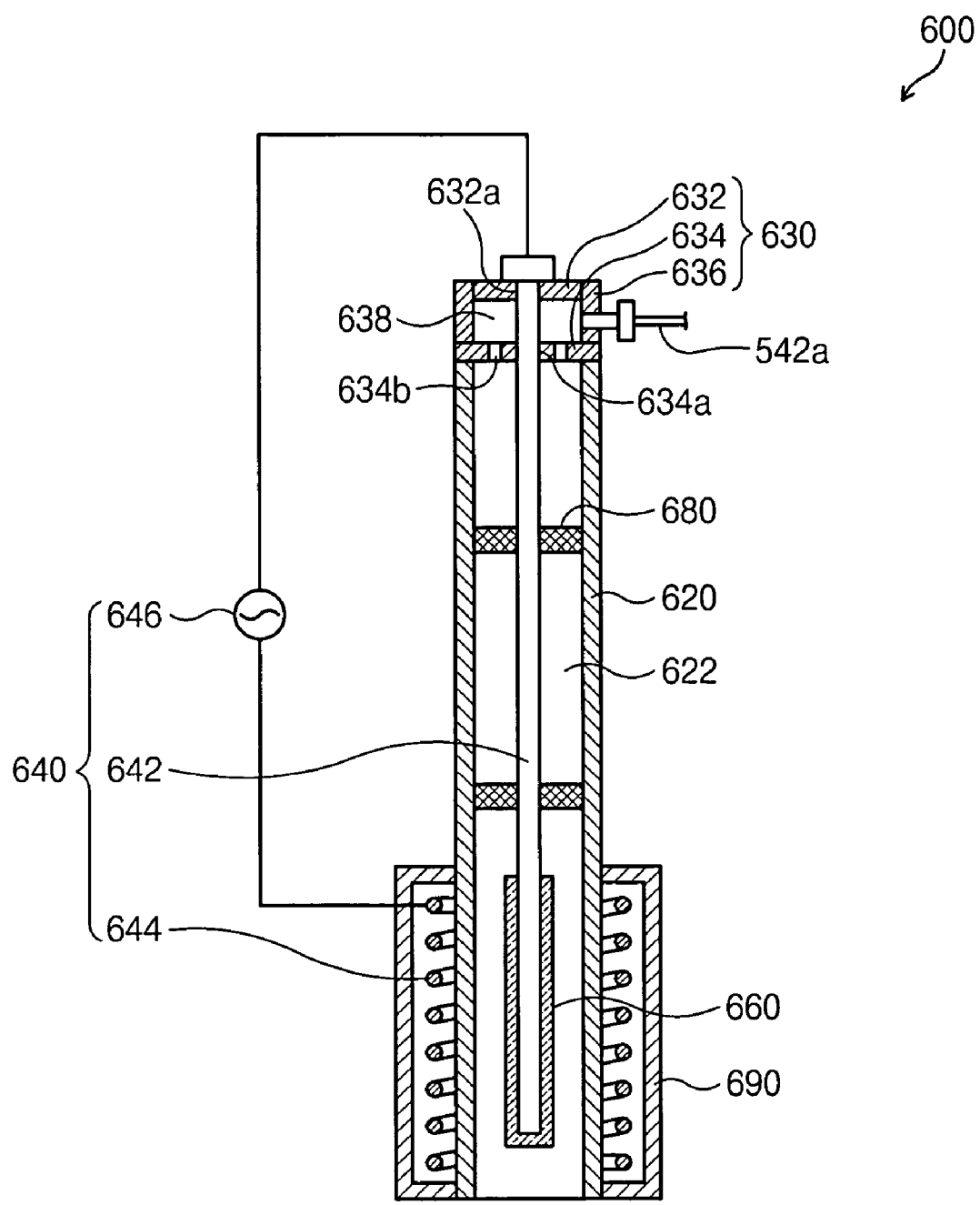
Figure 12:
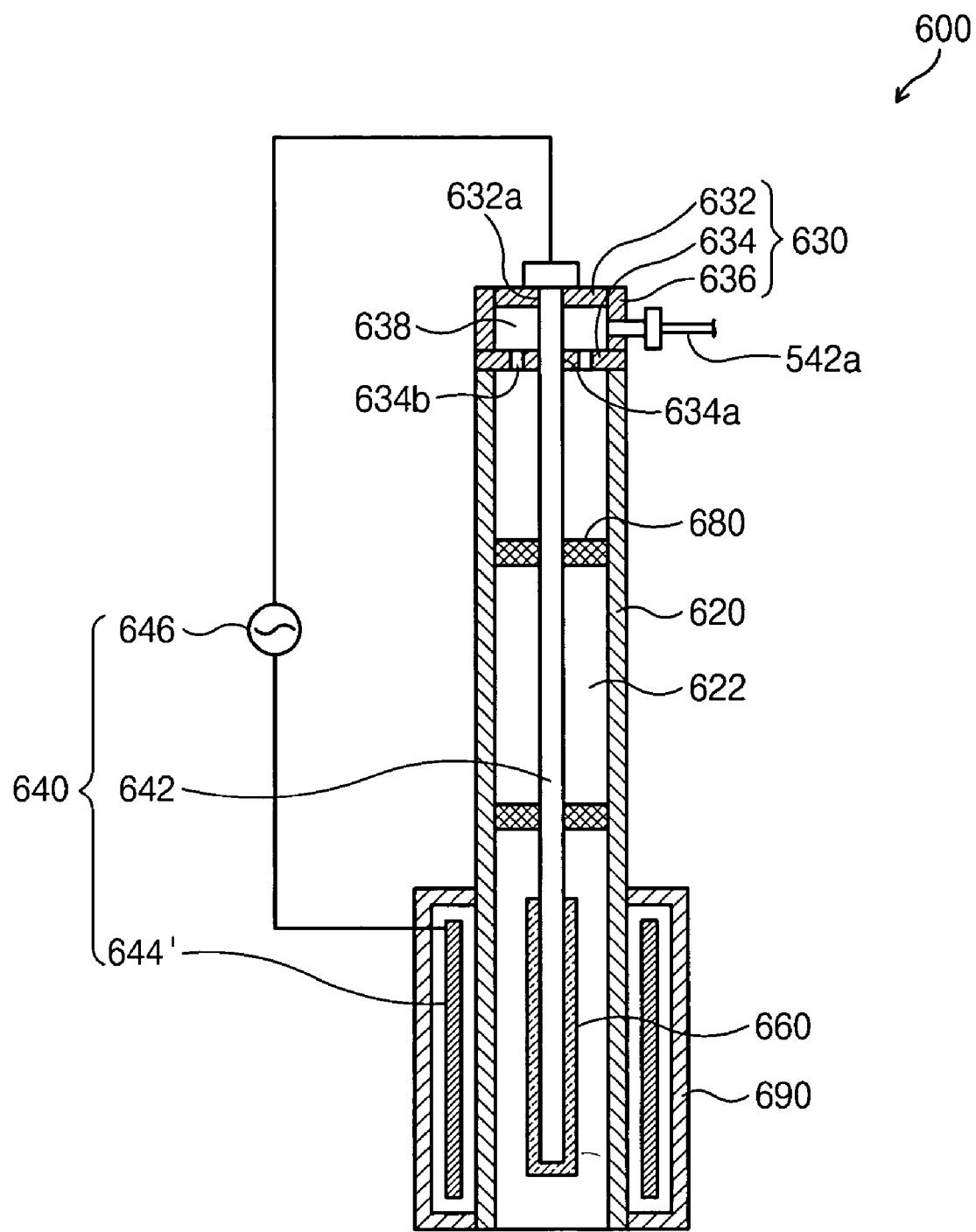
FIG. 12 is a cross-sectional view a plasma torch, showing a modified version of a second electrode.
Figure 13:
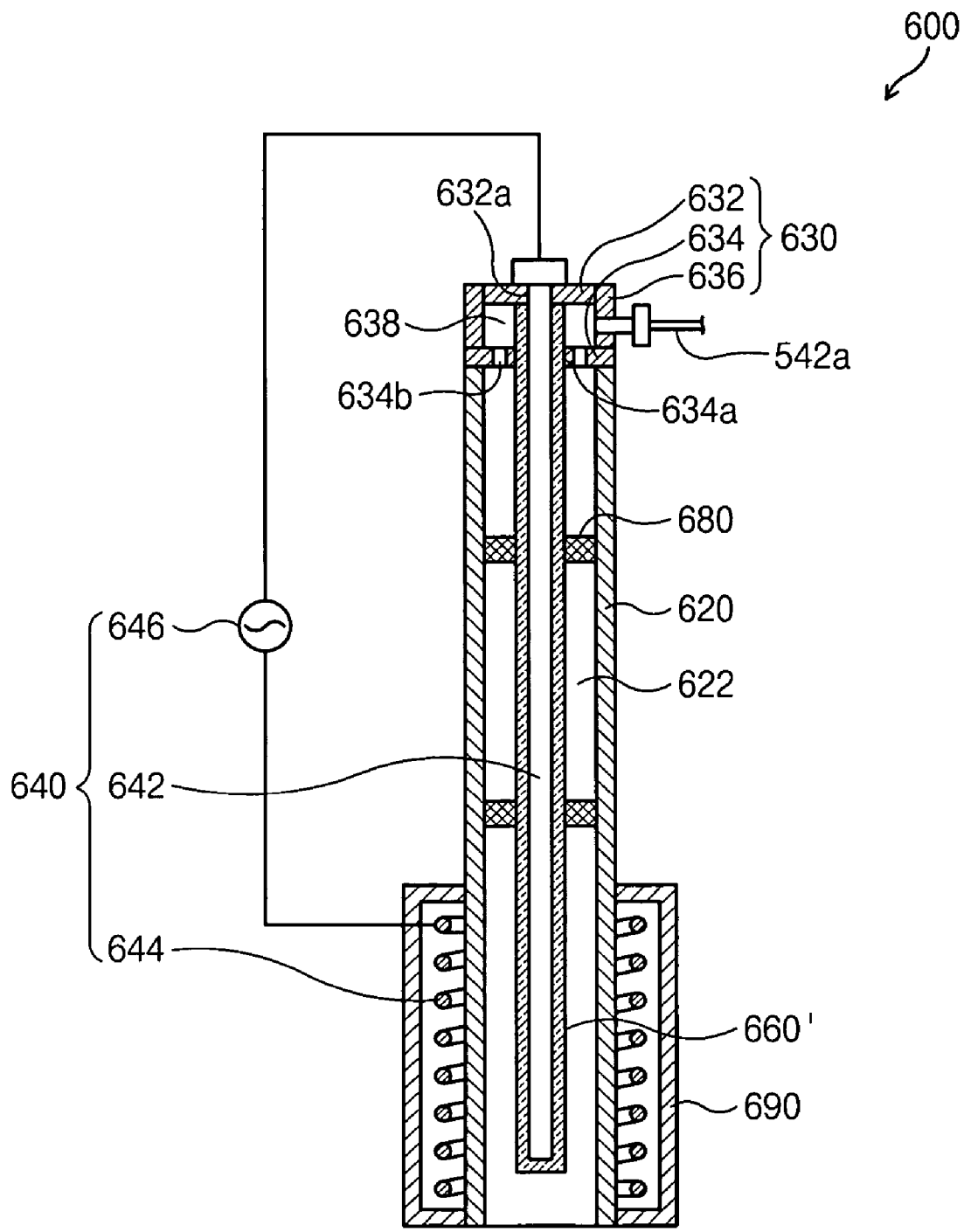
FIG. 13 is a cross-sectional view of a plasma torch, showing a modified version of a dielectric substance.

FIG. 10 and FIG. 11 are a perspective view and a cross-sectional view showing other examples of a plasma torch, respectively. As illustrated in FIG. 10 and FIG. 11, a plasma torch 600 has a body 620, an electrode part 640, a dielectric substance 660, an electrode holder 680, and a cover 690. The body 620 has a long cylindrical shape. A first space 622 formed long in a length direction is offered in the body 620. A gas flowing into the body 620 is changed into plasma-state gas. The first space 622 is open downwardly and is close upwardly by a top plate 630. Preferably, the first space 622 has a regular diameter in the length direction. The body 620 is made of dielectric material (e.g., quartz) to stably generate plasma. A second space 638 is formed in the top plate. A gas sojourns temporarily in the second space 638. The second space 638 has a top 632 and a bottom, which are opposite to each other, and a cylindrical side 636. Through-holes 632a and 634a are formed at the centers of the top 632 and the bottom 634, respectively. A port is formed at the side 636. A gas supply pipe 542a is connected to the port. A plurality of inflow holes 634b are formed around the through-hole 634a of the bottom 634. That is, a gas flows into the second space 638 through the gas supply pipe 542a and flows into the first space 622 through an inflow hole 634b. The gas is changed into a plasma-state gas in the first space 622. The plasma-state gas is supplied downwardly.

The electrode part 640 supplies an energy to change a gas flowing into the body 620 into a plasma-state gas. The electrode part 640 includes a first electrode 642, a second electrode 644, and an energy source 646. The first electrode 642 is a rod-shaped electrode that is long enough to be inserted into a lower portion in a first space 622 via through-holes 632a and 634a formed at a top plate 630. Width (or diameter) of the first electrode 642 is greater than that of the first space 622. The first electrode 642 is made of metal, preferably, tungsten. The second electrode 644 is disposed to cover an outer sidewall of the body 620. Specifically, the second electrode 644 is disposed to cover a lower portion of the outer sidewall of the body 620. Alternatively, the second electrode 644 may be disposed to entirely cover the outer sidewall of the body 620. Further, the second electrode 644 may be a coil-type electrode, as illustrated in FIG. 11. In some embodiments, a second electrode 644' may be a cylindrical plate electrode having a through-hole formed at its center. A body 620 is inserted into the through-hole of the second electrode 644'. Alternatively; the second electrode 644' may include a plurality of plates having a regular radius of curvature. The first and second electrodes 642 and 644 have different polarities. A high voltage may be applied to the first electrode 642, and a low voltage may be applied to the second electrode 644. Alternatively, a high voltage may be applied to the first electrode 642, and the second electrode 644 may be grounded. An energy source is coupled with the first and second electrodes 642 and 644. Preferably, the energy source may be a microwave or high-frequency power.

If a high voltage is applied to the first electrode 642, metal particles are separated from the first electrode 642 to be floated in the first space 622. These metal particles are supplied downwardly together with plasma to contaminate a wafer. Electrons are strongly emitted from the first electrode 642 to concentrate an electric field, which causes an arc generated at an area adjacent to the first electrode 642. The generation of the arc is intensively done at the end 642a of the first electrode 642, which is suppressed by the dielectric substance 660. The dielectric substance 660 covers at least a portion of the first electrode 642 and is made of dielectric material, preferably, quartz. Alternatively the dielectric substance 660 may be made of ceramic materials such as silicon carbide (SiC) or alumina. The dielectric substance 660 is disposed to cover the end 642a of the first electrode 642 as much as a determined length therefrom, as illustrated in FIG. 11. In some embodiments, a dielectric substance 660' may be disposed to entirely cover the first electrode 642 disposed in the first space 622. The dielectric substance 660 may be fabricated independently to coat the first electrode 642. Alternatively, the dielectric substance 660 may be formed by coating the first electrode 640 with high-purity dielectric material.

Figure 14:
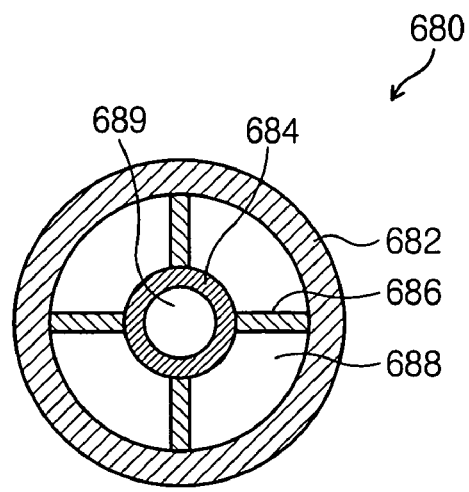
FIG. 14 is a top plan view of an electrode holder shown in FIG. 11.
Figure 15:
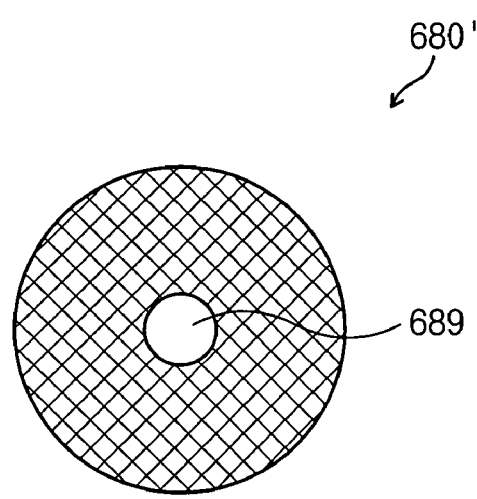
FIG. 15 is a top plan view showing another example of the electrode holder shown in FIG. 14.

When a process is being performed, the first electrode 642 must be disposed at the very center of the first space 622. If the first electrode 642 is disposed to one side or moves, a gas flowing into the firs space 622 does not flow smoothly and plasma is generated non-uniformly according to areas. An electrode holder 680 fixes the first electrode 642 to the very center in the first space 622 of the body 620. FIG. 14 is a top plan view of an exemplary electrode holder 680. The electrode holder 680 has a lateral outer face 682 and a lateral inner face 684. The lateral outer face 682 is a ring-shaped face that is fixed to a lateral inner face of the body 620, and the lateral inner face 684 is a ring-shaped face that is disposed in the outer lateral face 682 of the electrode holder 680 and has a through-hole 689 into which the first electrode 642 is inserted. A path 688 is formed between the lateral outer face 682 and the lateral inner face 684, enabling a gas to flow therethrough. The lateral outer face 682 and the lateral inner face 684 may be coupled with each other by one or more connecting rods 686. There may be one or more electrode holders 680 in the first space 622. FIG. 15 is a top plan view of another exemplary electrode holder 680'. The electrode holder 680' may be a net-shaped plate to enable a gas to flow. A through-hole 689 is formed at the center of the electrode holder 680'. A first electrode 642 is inserted into the through-hole 689.

When a process such an etch is performed using the above-described plasma torch 600, an externally supplied gas or residues created during the process are floated toward the second electrode 644. A gas reacts on the energy applied to the second electrode 644 to generate a spark in the vicinity of the second electrode 644. The spark has a bad influence upon the process and causes a loss of the energy applied to the second electrode 644. In order to prevent generation of the spark, a cover 690 is provided to cover the second electrode 644. That is, the second electrode 644 is not exposed to the outside due to the cover 690. The cover 690 may be made of Teflon. Preferably, the cover 690 is provided to entirely cover a circumference of the second electrode 644.

Figure 16:
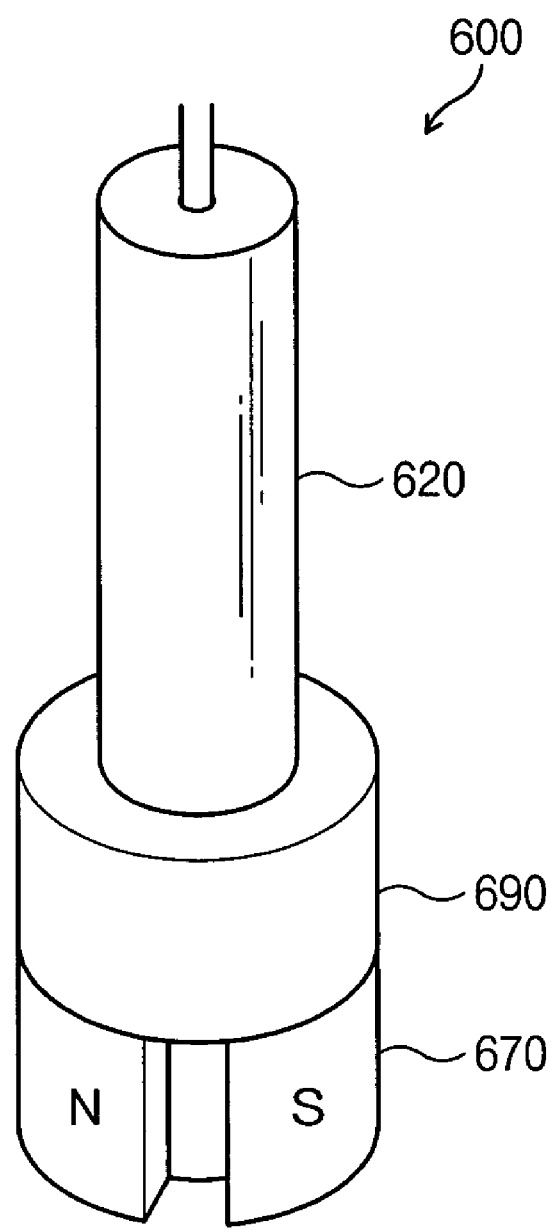
FIG. 16 and FIG. 17 are a perspective view and a cross-sectional view of a plasma torch having a magnet, respectively.
Figure 17:
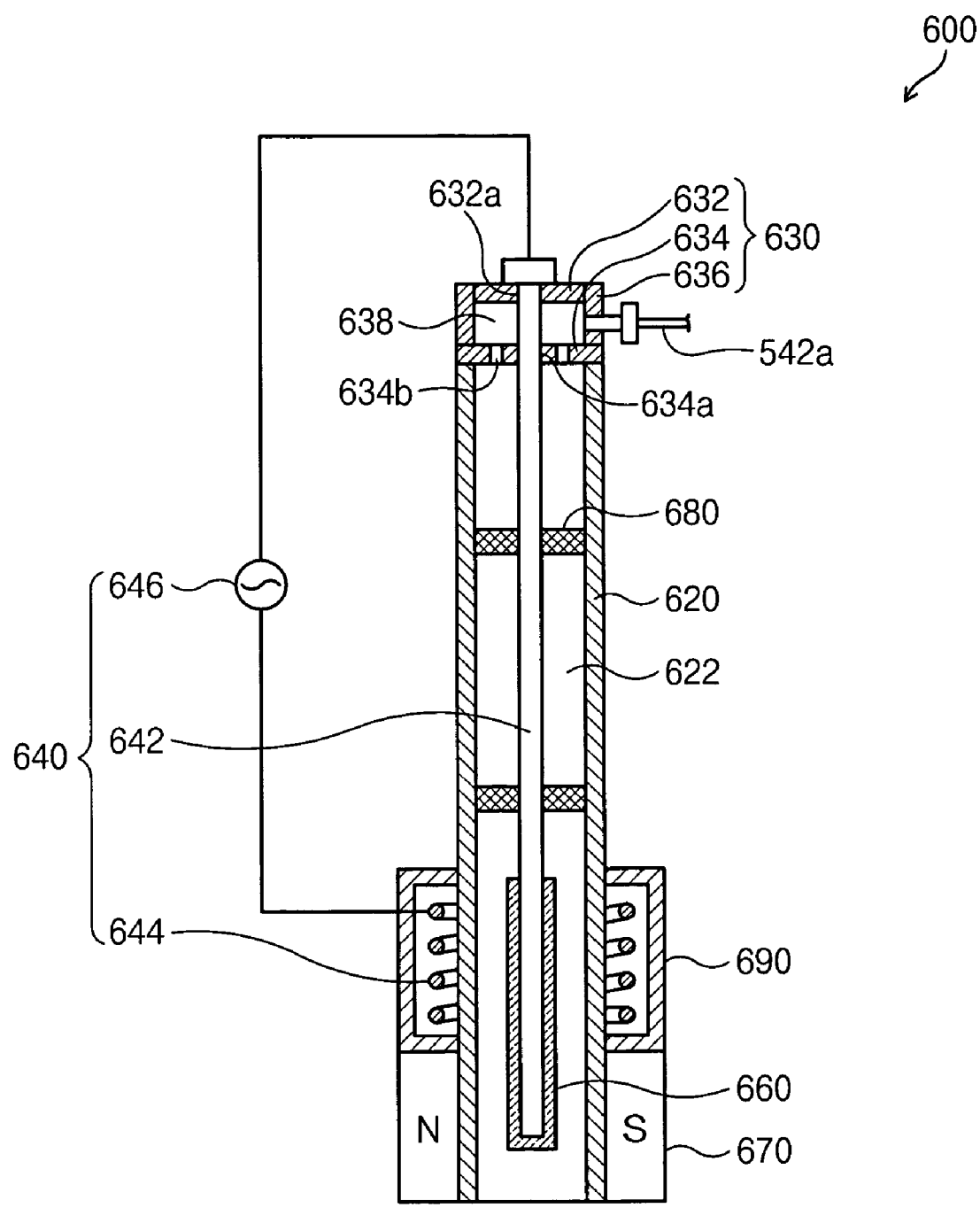

A sheath area and a mean free path of particles are shorter when plasma is generated at atmospheric pressure than when plasma is generated at vacuum. Therefore, an acceleration of the plasma is weaker at the atmospheric press than at the vacuum and thus the plasma may be supplied to an underlying wafer "W" without directionality. In order to overcome such a disadvantage, a magnet 670 may be provided to the plasma torch 600. FIG. 16 and FIG. 17 are a perspective view and a cross-sectional view of a plasma torch 600 having a magnet 670, respectively. The magnet 670 establishes a magnetic field at a migration path of plasma, accelerating ions passing the magnetic field and enabling the ions to migrate with directionality. The magnet 670 is disposed to cover an outer sidewall of a body 620 below a second electrode 644. Preferably, the magnet 670 is a permanent magnet. But the magnet 670 may be an electromagnet. According to a test, if a magnet is not provided when a layer on a wafer is etched, an etch rate of the layer was 37.5 Å/sec. On the other hand, if a magnet is provided under the same condition, an etch rate of the layer is 75 Å/sec.

Figure 18:
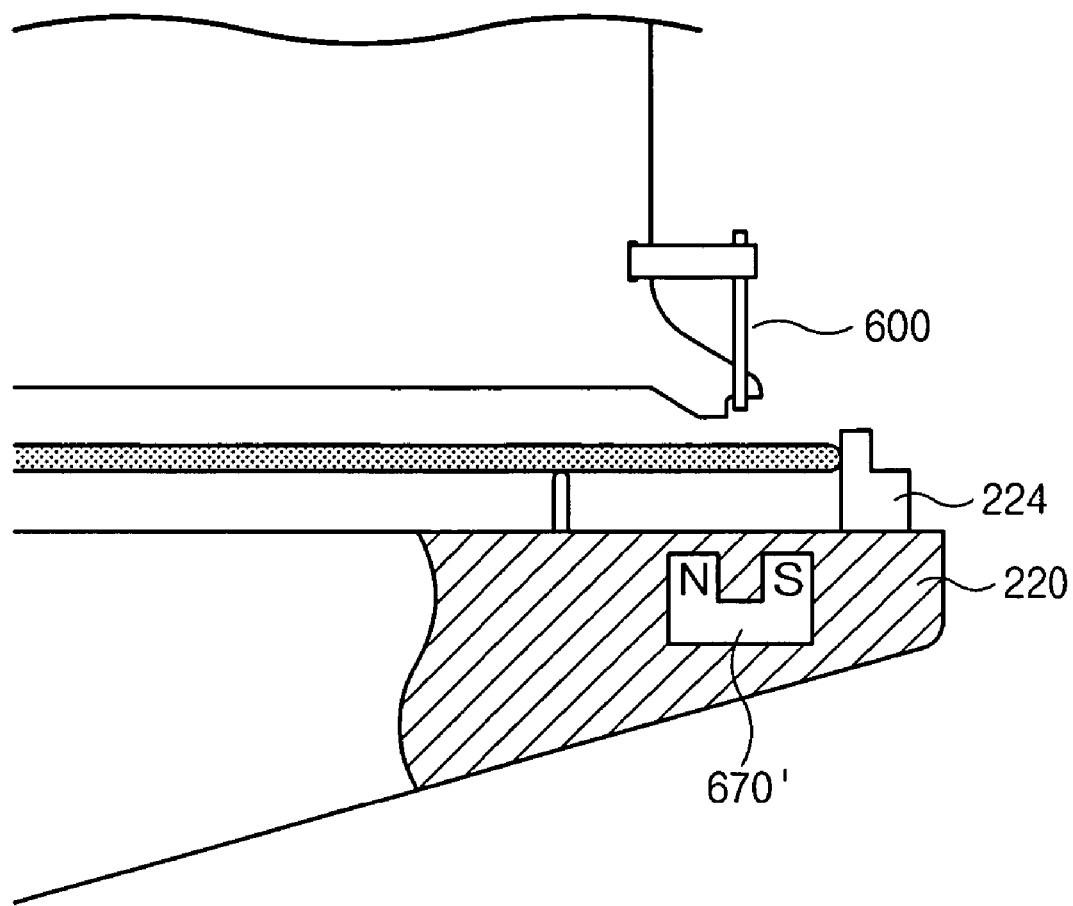
FIG. 18 shows that a magnet is installed at a support plate.

FIG. 18 shows another example of a location of a magnet 670' provided to accelerate plasma. The magnet 670' is provided in a support plate 200 on which a wafer "W" is placed, instead of an outer sidewall of a body 620. Preferably, the magnet 670' is disposed directly under an adjacent wafer "W". The magnet 670' is disposed to be opposite to the edge of a wafer "W" placed on the support plate 220. The magnet 670' may be disposed to be ring-shaped.

Figure 19:
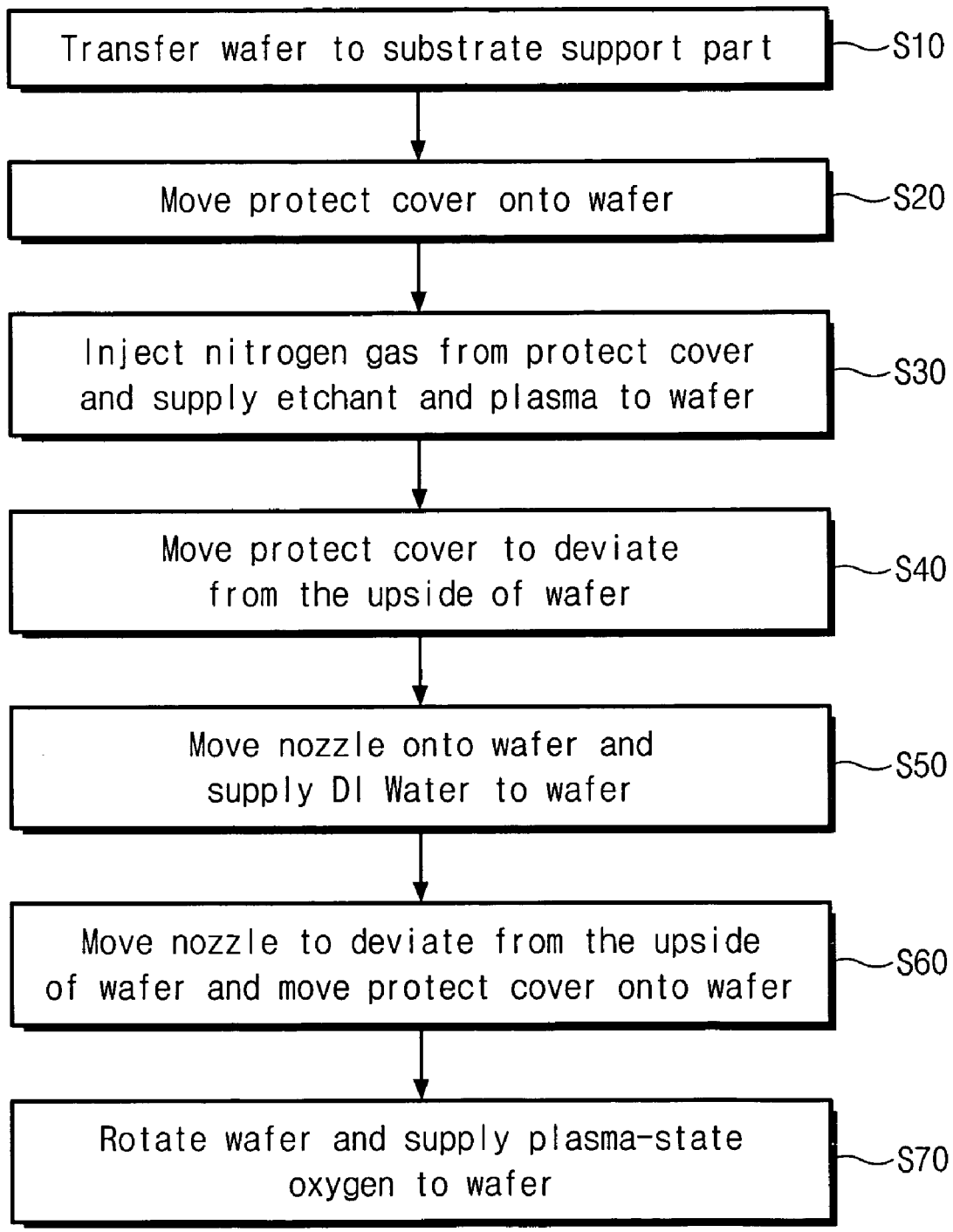
FIG. 19 is a flowchart for explaining a substrate treating method according to the present invention.

A method for treating a wafer 20 using the preventive substrate treating apparatus 1 will now be described hereinafter with reference to a flowchart of FIG. 19. A wafer 20 is placed on a support pin 222 of a substrate support part 200 and is aligned in position by an align pin 222 (S10). While a protect cover 320 moves and the wafer 20 is spaced apart therefrom as long as a predetermined distance, a boundary portion 324c of the protect cover 320 is disposed on a boundary portion of a non-etch portion 24b and the edge 24a of the protect cover 320 (S20). An etchant is supplied to a bottom surface 22 of the wafer 20, and plasma for an etch is injected to the top edge 24b of the wafer 20. At the same time, nitrogen gas is supplied from an injection port 328 formed at a horizontal portion 324a of the protect cover 320 (S30). If the etch is completed, the protect cover 320 is transferred to deviate from the upside of the wafer 20 (S40). A nozzle 720 configured for supplying a cleaning solution is transferred onto the center of the wafer 20, and deionized water (DI water) is supplied onto the wafer 20 from the nozzle 720 to clean the wafer 20 (S50). If the cleaning of the wafer 20 is completed, the nozzle 720 is transferred to deviate from the upside of the wafer 20 and the protect cover 320 is re-transferred to the above-mentioned location on the wafer 20 (S60). If the nozzle 720 is coupled with the protect cover 320, a cleaning process is directly performed without transferring the protect cover 320. While a substrate support part 200 is rotated at a high speed, the wafer 20 is dried. At the same time, plasma-state oxygen is supplied to the wafer edge 24b from a plasma torch 520 to remove foreign substances remaining at the wafer edge 24b and to form a passivation layer thereat (S70).

As explained so far, a wet etch and a dry etch are simultaneously performed. Therefore, an etch process is performed fast and a layer is not inclined at a boundary portion of a non-etch portion and the edge of a wafer during the wet etch. While drying a wafer, a plasma-state oxygen is supplied to the wafer to secondarily remove foreign substances remaining at the top edge of the wafer after the etch process and to prevent formation of a native oxide layer while transferring the wafer.

Further, a plasma torch is provided to prevent generation of an arc around an electrode when plasma is generated and to prevent metal particles separated from the electrode from acting as contaminants during a process. Since an electrode is fixedly installed at the inner center of a body of the plasma torch, a gas flows smoothly into the body and plasma is uniformly generated at an entire area. Since the electrode disposed outside the body is protected by a cover, gases or polymers do not react in the vicinity of the electrode. Thus, sparks are not generated to suppress energy loss.

Plasma generated from the plasma torch is supplied to a wafer while being accelerated in a determined direction. Thus, the wafer is uniformly treated and an anisotropic etch is achieved during the etch process.

Other modifications and variations to the invention will be apparent to a person skilled in the art from the foregoing disclosure. Thus, while only certain embodiment of the invention has been specifically described herein, it will be apparent that numerous modifications may be made thereto without departing from the spirit and scope of the invention.

What is claimed is:

1. An apparatus for treating a substrate, comprising:
   a substrate support part having a rotatable support plate and a support pin protruding from a top surface of the support plate to support a substrate to be spaced apart from a top surface of the support plate;
   a wet etch part for supplying wet etchant to a space between a bottom surface of the substrate placed on the support pin and the support plate and to an edge portion of the top surface of the substrate to perform an etch; and
   a dry etch part for supplying plasma to a boundary portion between the edge portion and a non-etch portion of the top surface of the substrate placed on the support plate to perform an etch, the non-etch portion being a portion to be unetched, and
   said wet etch part and said dry etch part, capable of performing an etch on said substrate simultaneously.

2. The apparatus of claim 1, wherein the dry etch part comprises:
   a plasma torch for enabling internally supplied gas to be excited into a plasma state and for injecting generated plasma to the edge of the substrate;
   a torch moving part for moving the plasma torch vertically or horizontally; and
   a gas supply part for supplying gas into the plasma torch.

3. The apparatus of claim 2, wherein the gas supply part comprises:
   a first supply pipe configured for supplying an etch gas to the plasma torch during an etch process; and
   a second supply pipe configured for supplying oxygen gas onto the substrate after the etch process is completed.

4. The apparatus of claim 1, further comprising:
   a protection part spaced apart from the top surface of the wafer for preventing the wet etchant from flowing into the non-etch portion of the top surface of the substrate.

5. The apparatus of claim 2, wherein the protection part comprises:
   a protect cover having a protrusion formed to correspond to a boundary portion between the non-etch portion and the edge portion of the top surface of the substrate and a bottom where a supply hole is configured for injecting nitrogen gas or inert gas into the protrusion; and
   a cover moving part for moving the protect cover vertically or horizontally.

6. The apparatus of claim 5, wherein the plasma torch is connected with the protect cover.

7. The apparatus of claim 1, wherein the wet etch part comprises:
   a chemical flow path formed in the support plate as a flow path of an etchant supplied to the space; and
   a chemical supply pipe connected with the chemical supply part and the chemical flow path to supply an etchant to the chemical flow path.

8. The apparatus of claim 1, wherein the edge portion of the top surface of the substrate and the bottom surface of the substrate are etched by the wet etch part, and a portion adjacent to the boundary portion between the edge portion and the non-etch portion of the substrate is etched by the dry etch part.

9. The apparatus of claim 2, wherein the plasma torch comprises: a body in which a gas inflow space is formed, the body being made of dielectric material;
   a first electrode inserted into the gas inflow space of the body;
   a second electrode disposed to cover at least a part of the outer sidewall of the body; and
   a dielectric substance covering at least a part of the second electrode, the dielectric substance being made of dielectric material.

10. The apparatus of claim 9, wherein the gas inflow space is straightly formed in the body, and the first electrode is a rod-shaped electrode that is straightly disposed at the center of the space along the gas inflow space.

11. The apparatus of claim 9, wherein the dielectric substance is disposed to cover the end of the first electrode.

12. The apparatus of claim 9, wherein the dielectric substance is formed by coating the first electrode with dielectric material.

13. The apparatus of claim 9, wherein the second electrode is a coil-type electrode or a plate-type electrode.

14. The apparatus of claim 9, wherein the plasma torch further comprises: a cover disposed to cover the second electrode to prevent the second electrode from being exposed to the outside.

15. The apparatus of claim 9, wherein the plasma torch further comprises: at least one electrode holder disposed at the space in the body to fix the first electrode.

16. The apparatus of claim 9, further comprising:
   a magnet for establishing a magnetic field at a migration path of plasma generated in the body to offer an acceleration force to the plasma.

17. The apparatus of claim 16, wherein the magnet is disposed to surround the outer sidewall of the body below the second electrode.

18. The apparatus of claim 16, wherein the magnet is installed at the support part.

* * * * *

UNITED STATES PATENT AND TRADEMARK OFFICE
CERTIFICATE OF CORRECTION

PATENT NO. : 7,323,080 B2  Page 1 of 1
APPLICATION NO. : 11/084,034
DATED : January 29, 2008
INVENTOR(S) : In-Jun Kim et al.

It is certified that error appears in the above-identified patent and that said Letters Patent is hereby corrected as shown below:

Title Page, item [54] Title left column, should read as follows:

--APPARATUS FOR TREATING SUBSTRATE--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,323,080 B2 | Page 1 of 1 |
| APPLICATION NO. | : 11/084,034 | |
| DATED | : January 29, 2008 | |
| INVENTOR(S) | : In-Jun Kim et al. | |

It is certified that error appears in the above-identified patent and that said Letters Patent is hereby corrected as shown below:

Title Page, item [54] and Column 1, line 1 Title left column, should read as follows:

--APPARATUS FOR TREATING SUBSTRATE--

This certificate supersedes the Certificate of Correction issued May 13, 2008.

Signed and Sealed this

Third Day of June, 2008

JON W. DUDAS
*Director of the United States Patent and Trademark Office*